(12) United States Patent  
Komine et al.

(10) Patent No.: US 8,976,356 B2  
(45) Date of Patent: Mar. 10, 2015

(54) MEASUREMENT MARK, METHOD FOR MEASUREMENT, AND MEASUREMENT APPARATUS

(71) Applicant: Kabushiki Kaisha Toshiba, Tokyo (JP)

(72) Inventors: Nobuhiro Komine, Mie-ken (JP); Yosuke Okamoto, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 61 days.

(21) Appl. No.: 13/944,297

(22) Filed: Jul. 17, 2013

(65) Prior Publication Data

US 2014/0240704 A1    Aug. 28, 2014

Related U.S. Application Data

(60) Provisional application No. 61/770,674, filed on Feb. 28, 2013.

(51) Int. Cl.
 *G01B 11/00* (2006.01)
 *H01L 21/66* (2006.01)
 *G03F 7/00* (2006.01)

(52) U.S. Cl.
 CPC . *H01L 22/12* (2013.01); *G03F 7/00* (2013.01)
 USPC ............................ 356/401; 356/399; 356/400

(58) Field of Classification Search
 CPC ...... G01B 11/00; G01B 11/27; G01B 11/002; G01B 2290/70; G01B 9/02084; G03F 7/70633; G03F 9/00; H01L 23/544; G03C 5/00
 USPC .................................................. 356/399–401
 See application file for complete search history.

(56) References Cited

U.S. PATENT DOCUMENTS

| | | | |
|---|---|---|---|
| 6,486,954 B1* | 11/2002 | Mieher et al. | 356/401 |
| 7,175,945 B2* | 2/2007 | Mieher et al. | 430/5 |
| 7,265,021 B2 | 9/2007 | Yudasaka et al. | |
| 7,349,105 B2* | 3/2008 | Weiss | 356/620 |
| 7,368,208 B1* | 5/2008 | Adel et al. | 430/22 |
| 7,612,882 B2* | 11/2009 | Wu et al. | 356/401 |
| 7,667,842 B2* | 2/2010 | Schulz | 356/401 |
| 7,906,257 B2 | 3/2011 | Itoh | |

FOREIGN PATENT DOCUMENTS

| | | |
|---|---|---|
| JP | 2004-031542 A | 1/2004 |
| JP | 2007-315877 A | 12/2007 |
| JP | 2010-053263 A | 3/2010 |

* cited by examiner

*Primary Examiner* — Tarifur Chowdhury
*Assistant Examiner* — Isiaka Akanbi
(74) *Attorney, Agent, or Firm* — Posz Law Group, PLC

(57) ABSTRACT

According to one embodiment, a measurement mark includes: a first line pattern, first lines extending in a first direction, the first lines arranged in a second direction in the first line pattern, the first line pattern capable of forming a first moire pattern by overlapping with an arrangement pattern including a pattern, and a first polymer and a second polymer being alternately arranged in the pattern; a second line pattern, second lines extending in the first direction, the second lines being arranged in the second direction in the second line pattern, the second line pattern capable of forming a second moire pattern by overlapping with the arrangement pattern; and a reference pattern with a reference position configured to assess a first shift amount from the reference position of the first moire pattern and a second shift amount from the reference position of the second moire pattern.

15 Claims, 7 Drawing Sheets

US 8,976,356 B2

MEASUREMENT MARK, METHOD FOR MEASUREMENT, AND MEASUREMENT APPARATUS

CROSS-REFERENCE TO RELATED APPLICATIONS

This application is based upon and claims the benefit of priority from U.S. Provisional Patent Application 61/770,674, filed on Feb. 28, 2013; the entire contents of which are incorporated herein by reference.

FIELD

Embodiments described herein relate generally to a measurement mask, a method for measurement, and a measurement apparatus.

BACKGROUND

These days, as the miniaturization of the circuit patterns of electronic devices progresses, it is required to form a regular arrangement pattern of several nanometers to several tens of nanometers on an underlayer. As a method for forming the arrangement pattern, a process using a self-assembly phenomenon in which a substance spontaneously forms an arrangement pattern is promising. For example, a process using a self-assembly phenomenon of high molecular block copolymers (what is called a microphase separation phenomenon) can form a fine regular structure by a simple application process. When a circuit pattern is formed using a self-assembly phenomenon, in general, a trench called a guide is formed and then high molecular block copolymers are applied into the trench beforehand.

However, the positional shift of the guide to the underlayer and the positional shift of the regular structure to the underlayer may not necessarily be equal. Thus far, the positional shift inspection has been performed by image processing using visible light. However, since the pattern using a self-assembly phenomenon is at or below the resolution limit of visible light, it is difficult to inspect the positional shift between the underlayer and the pattern utilizing a self-assembly phenomenon. Thus, in order to use a self-assembly phenomenon for circuit pattern formation, it is necessary to enhance the inspection accuracy of the positional shift between the pattern utilizing a self-assembly phenomenon and the circuit pattern on the underlayer.

DETAILED DESCRIPTION

Figure 1A:
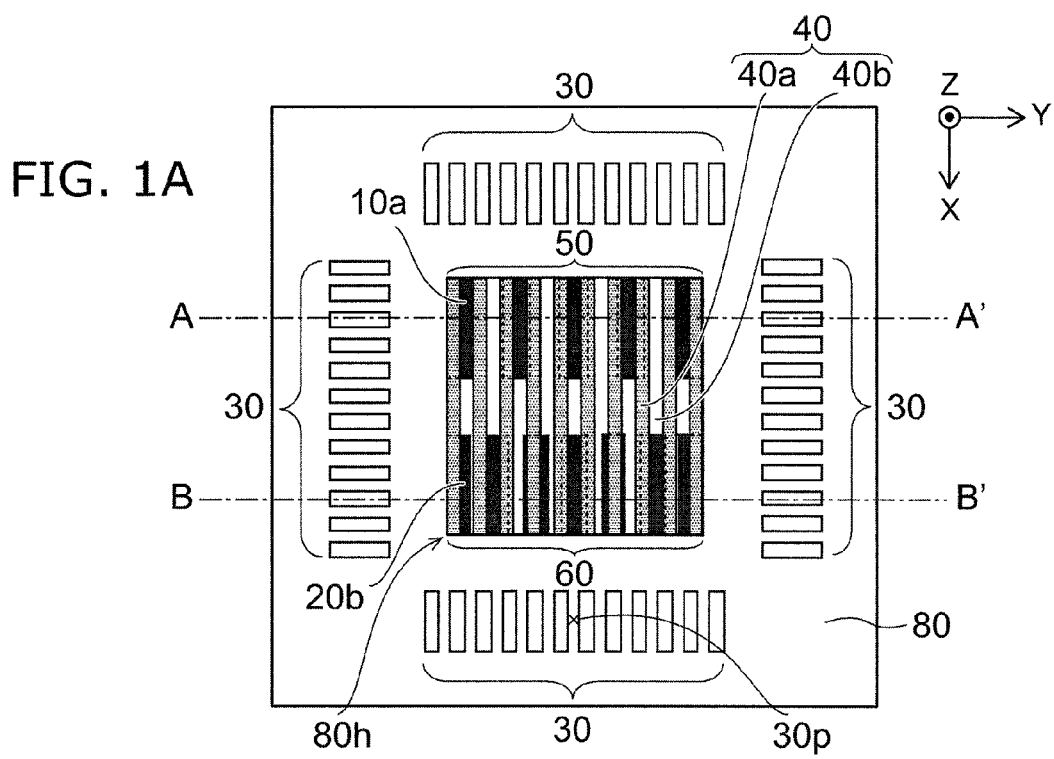
FIG. 1A is a schematic plan view of a measurement mark according to an embodiment.

In general, according to one embodiment, a measurement mark includes: a first line pattern provided on an underlayer, a plurality of first lines extending in a first direction, the plurality of first lines being arranged in a second direction crossing the first direction in the first line pattern, the first line pattern being capable of forming a first moire pattern by overlapping with an arrangement pattern including a pattern, and a first polymer and a second polymer being alternately arranged in the pattern; a second line pattern provided on the underlayer and aligned with the first line pattern in the first direction, a plurality of second lines extending in the first direction, the plurality of second lines being arranged in the second direction in the second line pattern, the second line pattern being capable of forming a second moire pattern with a second period different from a first period of the first moire pattern by overlapping with the arrangement pattern; and a reference pattern provided on the underlayer and provided with a reference position configured to assess a first shift amount from the reference position of the first moire pattern and a second shift amount from the reference position of the second moire pattern.

Hereinbelow, embodiments are described with reference to the drawings. In the following description, identical components are marked with the same reference numerals, and a description of components once described is omitted as appropriate.

Figure 1B:
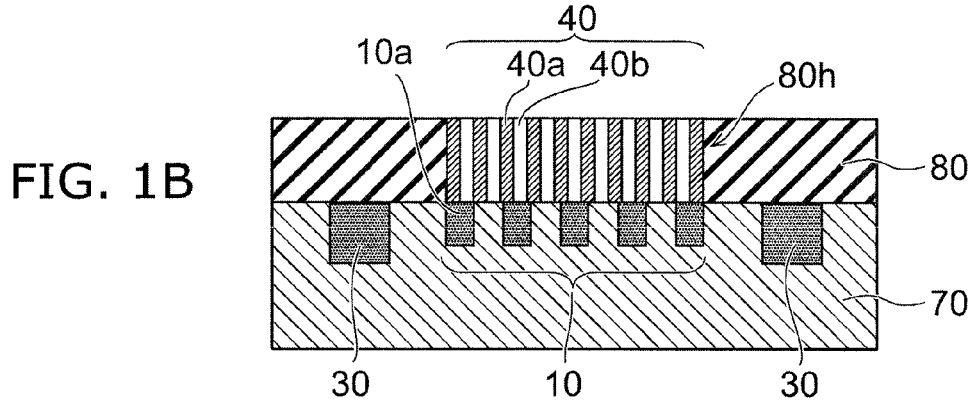
FIG. 1B and FIG. 1C are schematic cross-sectional views of the measurement mark according to the embodiment.
Figure 1C:
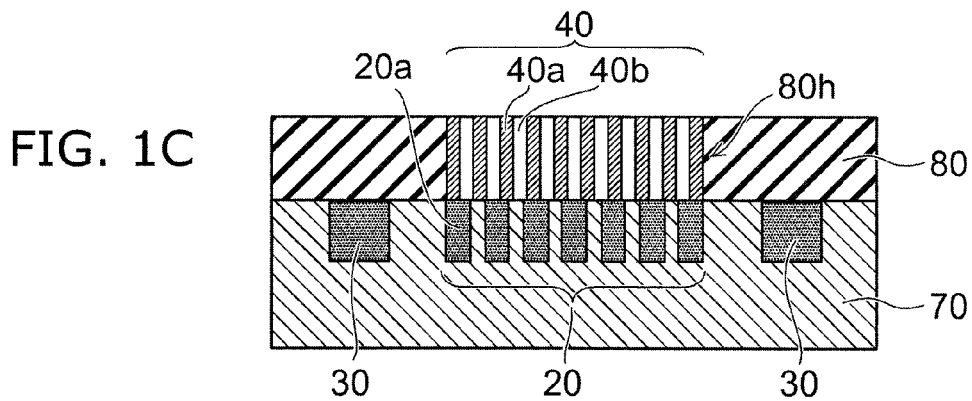

FIG. 1A is a schematic plan view of a measurement mark according to an embodiment, and FIG. 1B and FIG. 1C are schematic cross-sectional views of the measurement mark according to the embodiment. FIG. 1B is a cross section in the position of line A-A' of FIG. 1A, and FIG. 1C is a cross section in the position of line B-B' of FIG. 1A.

A measurement mark 1 is provided on an underlayer such as a semiconductor wafer. The measurement mark 1 is used as, for example, a mark for the position control etc. of a pattern or the like in a wafer process. The use of the measurement mark 1 is not limited to these uses. The measurement mark 1 has a first line pattern 10, a second line pattern 20, and a reference pattern 30. In FIG. 1A to FIG. 1C, a first polymer 40a and a second polymer 40b are alternately arranged on the first line pattern 10 and on the second line pattern 20. The line width of each of the first polymer 40a and the second polymer 40b is several nanometers (nm) to several tens of nanometers.

The first line pattern 10 is provided on an underlayer 70. The first line pattern 10 is a line pattern in which a plurality of first lines 10a extending in an X direction (a first direction) are arranged in a Y direction (a second direction) crossing the X direction. The first line pattern 10 can form a first moire pattern 50 by overlapping with an arrangement pattern 40 including a pattern in which the first polymer 40a and the second polymer 40b are alternately arranged.

The first polymer 40a is, for example, polystyrene (abbreviation: PS). The second polymer 40b is, for example, poly (methyl methacrylate) (abbreviation: PMMA). Each of the first polymer 40a and the second polymer 40b extends in the X direction.

The second line pattern 20 is provided on the underlayer 70. The second line pattern 20 is aligned with the first line pattern 10 in the X direction. The second line pattern 20 is a line pattern in which a plurality of second lines 20a extending in the X direction are arranged in the Y direction. The period in the Y direction of the second line pattern 20 is different from the period in the Y direction of the first line pattern 10. The second line pattern 20 can form a second moire pattern 60 with a period (a second period) different from the period (a first period) of the first moire pattern 50 by overlapping with the arrangement pattern 40.

The reference pattern 30 is provided on the underlayer 70. The reference pattern 30 has a reference position 30p. By the reference position 30p being provided in the reference pattern 30, the shift amount from the reference position 30p of the first moire pattern 50 (a first shift amount) and the shift amount from the reference position 30p of the second moire pattern 60 (a second shift amount) can be assessed.

For example, when there is no shift in the first moire pattern 50 or the second moire pattern 60, the shift amount from the reference position 30p of the first moire pattern 50 and the shift amount from the reference position 30p of the second moire pattern 60 are zero (0). The first moire pattern 50 or the second moire pattern 60 in the state where the shift amount is zero (0) is found beforehand by simulation, experiment, etc.

A guide layer 80 surrounding the arrangement pattern 40 is provided on the underlayer 70. The guide layer 80 has an opening 80h. The first line pattern 10 and the second line pattern 20 are exposed from the guide layer 80 in the opening 80h. The reference pattern 30 is covered by the guide layer 80.

The reference pattern 30 is aligned with the first line pattern 10 and the second line pattern 20 in the X direction or in the opposite direction to the X direction. Alternatively, the reference pattern 30 is aligned with the first line pattern 10 and the second line pattern 20 in the Y direction or in the opposite direction to the Y direction.

A measurement method using the measurement mark 1 will now be described.

Figure 2:
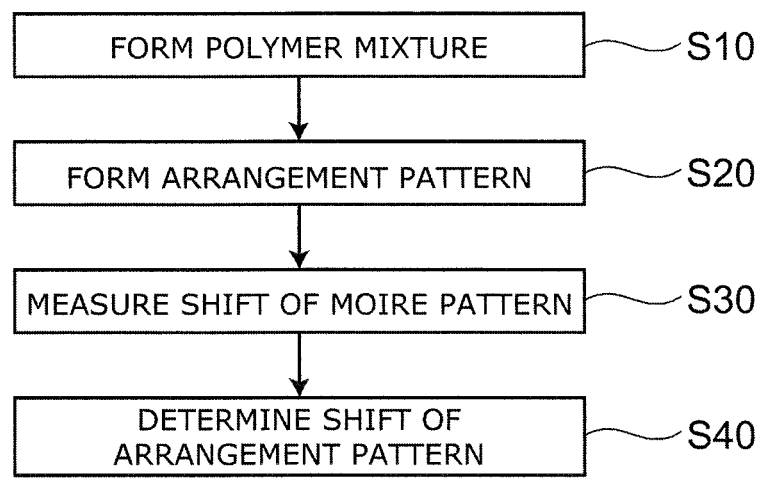
FIG. 2 is a flow chart showing a measurement method according to the embodiment.

FIG. 2 is a flow chart showing a measurement method according to the embodiment.

Figure 3A:
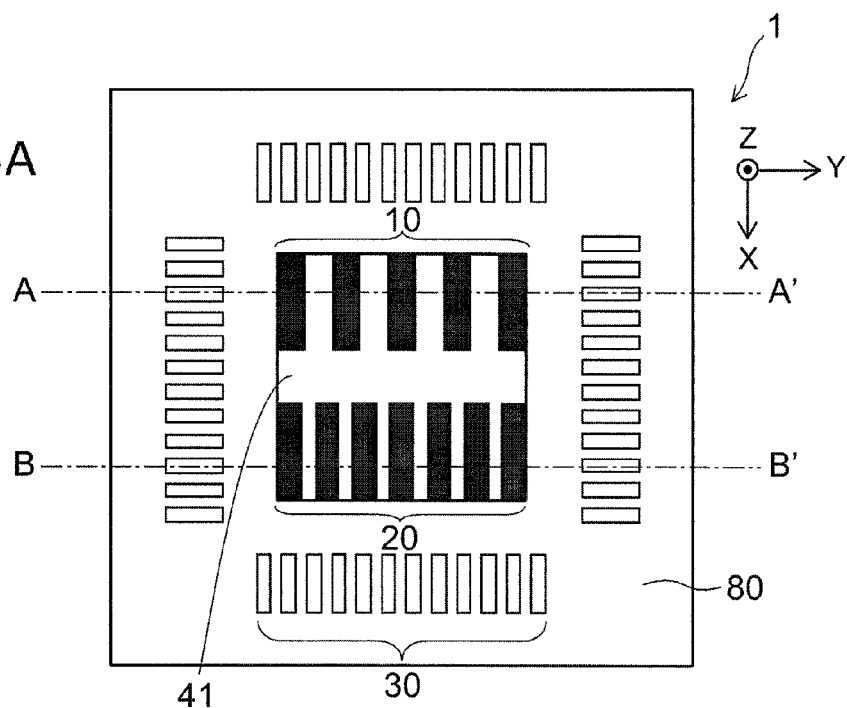
FIG. 3A is a schematic plan view showing the measurement method according to the embodiment.
Figure 3B:
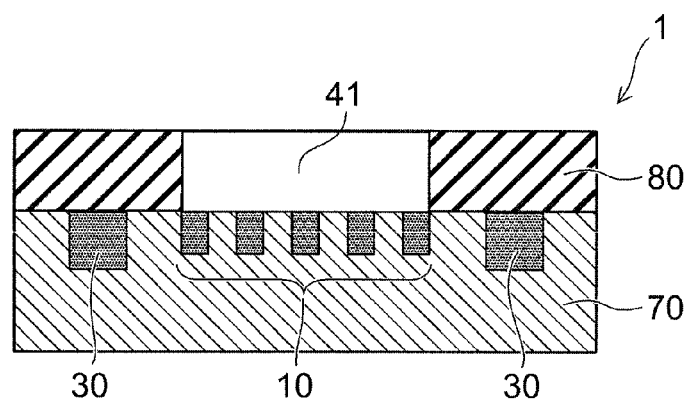
FIG. 3B and FIG. 3C are schematic cross-sectional views showing the measurement method according to the embodiment.
Figure 3C:
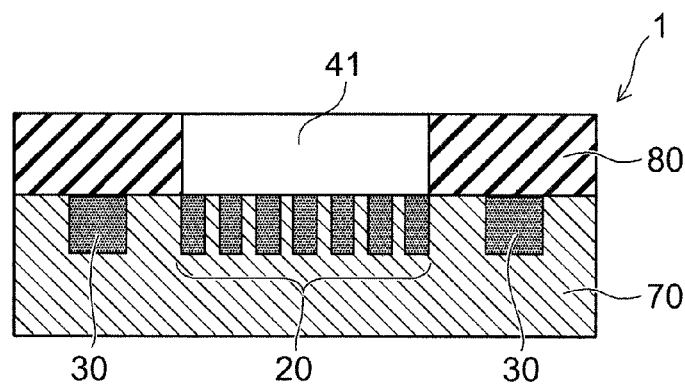

FIG. 3A is a schematic plan view showing the measurement method according to the embodiment, and FIG. 3B and FIG. 3C are schematic cross-sectional views showing the measurement method according to the embodiment. FIG. 3B is a cross section in the position of line A-A' of FIG. 3A, and FIG. 3C is a cross section in the position of line B-B' of FIG. 3A.

FIG. 4A to FIG. 5B are schematic diagrams showing the measurement method according to the embodiment.

The underlayer 70 provided with the measurement mark 1 and the guide layer 80 is prepared beforehand. The underlayer 70 includes, for example, a semiconductor substrate, a semiconductor wafer, or the like. The underlayer 70 may be a semiconductor substrate itself, or may be a substrate in which an insulating layer is provided on a semiconductor base. The guide layer 80 includes, for example, a resist.

First, as shown in FIG. 3A to FIG. 3C, a polymer mixture 41 containing the first polymer 40a and the second polymer 40b is prepared on the first line pattern 10 and on the second line pattern 20 of the measurement mark 1 (step S10).

Next, the polymer mixture 41 is phase-separated by, for example, heating treatment. In the case where the affinity between the side wall of the guide layer 80 and one polymer is high, the one polymer comes into contact with the side wall of the guide layer 80. Starting from the polymer that has come into contact, two polymers are alternately arranged in a regular manner.

In the embodiment, this state is already shown in FIG. 1. In other words, on the underlayer 70, the arrangement pattern 40 in which the first polymer 40a and the second polymer 40b are alternately arranged is formed on the first tine pattern 10 and on the second line pattern 20 (step S20). The embodiment illustrates, as an example, the case where the affinity between the side wall of the guide layer 80 and the first polymer 40a is higher than the affinity between the side wall of the guide layer 80 and the second polymer 40b.

Next, the shift amount (the first shift amount) from the reference position 30p of the first moire pattern 50 formed by the overlapping of the first line pattern 10 and the arrangement pattern 40 is measured. Furthermore, the shift amount (the second shift amount) from the reference position 30p of the second moire pattern 60 formed by the overlapping of the second line pattern 20 and the arrangement pattern 40 is measured (step S30).

Figure 4A:
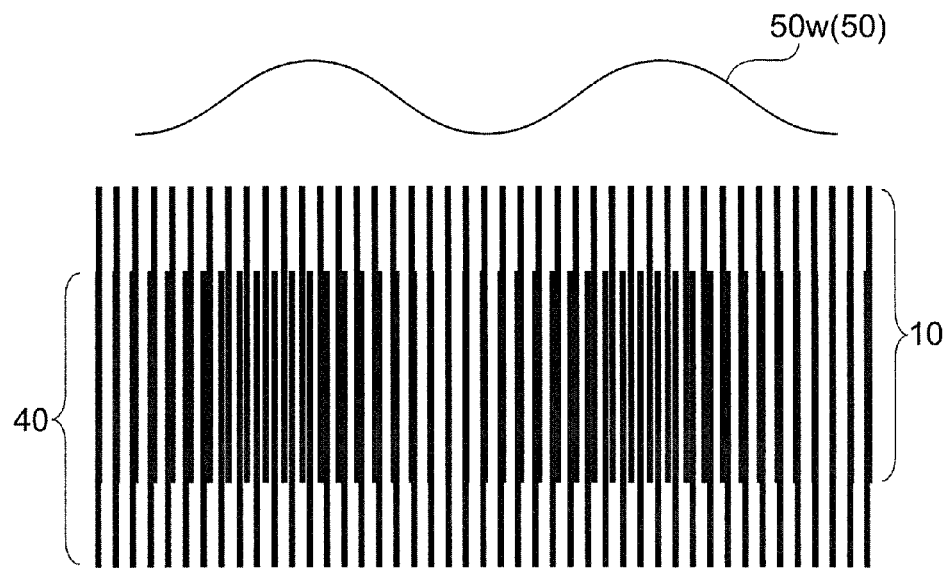
FIG. 4A to FIG. 5B are schematic diagrams showing the measurement method according to the embodiment.
Figure 4B:
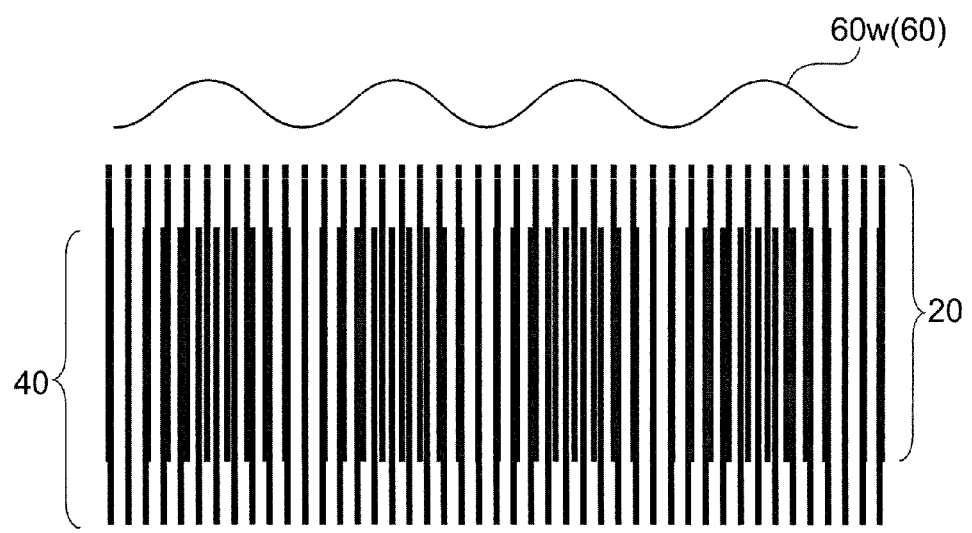

For example, as shown in FIG. 4A and FIG. 4B, two moire fringes shown in FIG. 4A and FIG. 4B are observed due to the arrangement pattern 40 formed by the self-assembly phenomenon and the first line pattern 10 and the arrangement pattern 40 and the second line pattern 20. In FIG. 4A and FIG. 4B, one of the first polymer 40a and the second polymer 40b of the arrangement pattern 40 is indicated by the black line.

As described above, the period of the first line pattern 10 and the period of the second line pattern 20 are different. Therefore, when it is assumed that the moire pattern has a waveform in which the dark colored portion is convex and the light colored portion is concave, a phenomenon is obtained in which the period of the waveform 50w of the first moire pattern 50 and the period of the waveform 60w of the second moire pattern 60 are different. The wavelength of the waveform 50w and the wavelength of the waveform 60w are larger than the wavelength of the arrangement pattern 40.

Figure 5A:
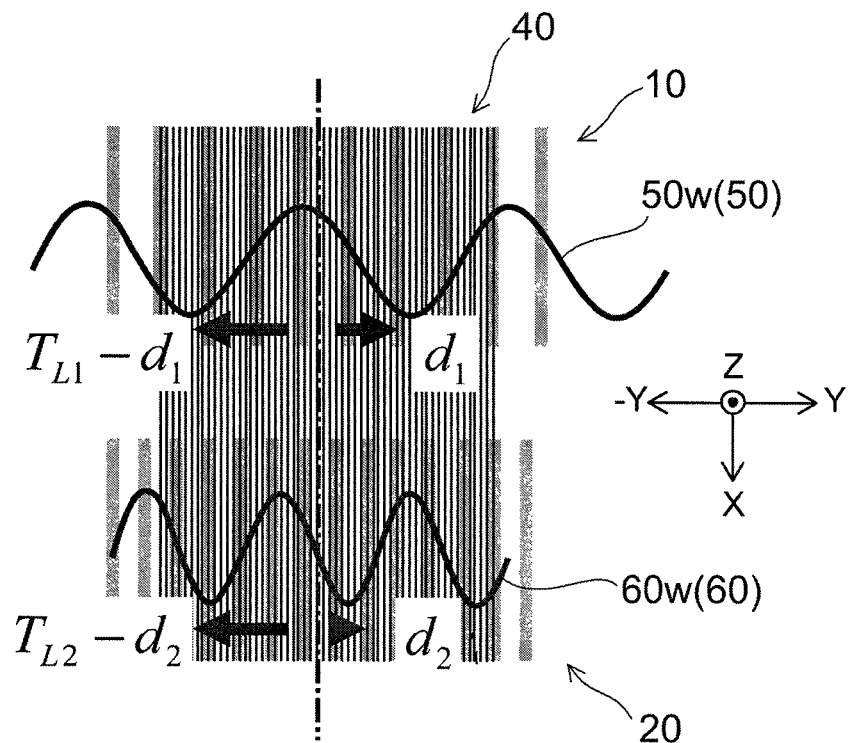

FIG. 5A shows a state where the arrangement pattern 40 is shifted from the reference position 30p. TL1 and TL2 shown in FIG. 5A express the pitch of the node (or antinode) of the waveform. Each of TL1 and TL2 corresponds to each of λL1 and λL2 described later. When the arrangement pattern shifts, the first moire pattern 50 and the second moire pattern 60 shift accordingly. Since the line width of each of the first polymer 40a and the second polymer 40b is at or below the resolution limit of visible light, optical means have a limited capability of directly observing the shift from the reference position 30p of the arrangement pattern 40.

However, the wavelength of the waveform 50w and the wavelength of the waveform 60w are larger than the wavelength of the arrangement pattern 40. Thereby, the shift from the reference position 30p of the arrangement pattern 40 can be found indirectly by measuring the shift from the reference position 30p of the first moire pattern 50 or the second moire pattern 60.

When the shift from the reference position 30p of the arrangement pattern 40 is assessed from the shift of the waveforms 50w and 60w, another method is further needed. For example, it is assumed that the arrangement pattern 40 is shifted from the reference position 30p by 5 in the Y direction (the right side of the drawing). In this case, also the waveform 50w is shifted from the reference position 30p by a certain amount d1 in the Y direction (the right side).

In the waveform 50w, a waveform shifted by d1 in the Y direction (the right side of the drawing) and a waveform shifted in the −Y direction (the left side of the drawing) by (λL1−d1), which is a value obtained by subtracting d1 from the wavelength λL1 of the waveform 50w, are apparently waveforms with no phase difference. Therefore, the shift of the waveform 50w does not make it possible to determine whether the arrangement pattern 40 is shifted in the Y direction (the right side of the drawing) or in the −Y direction (the left side of the drawing) from the reference position 30p.

Figure 5B:
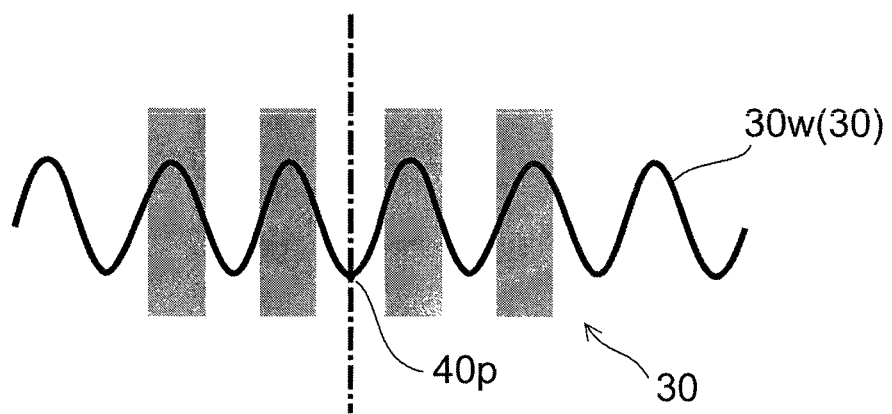

The same phenomenon occurs also for the waveform 60w. In other words, one moire pattern by itself does not make it possible to determine the shift from the reference position 30p of the arrangement pattern 40. In FIG. 5A, the shift amount of the waveform 60w is denoted by d2, and the wavelength is denoted by λL2. FIG. 5B shows the waveform 30w of the reference pattern 30. Thus, in the embodiment, the method described below is introduced.

In the embodiment, the shift amount from the reference position 30p of the arrangement pattern 40 is determined from d1 (the first shift amount), a first difference between λL1 (a first wavelength) calculated from TL1 (the first period) and d1 (the first shift amount), d2 (the second shift amount), and a second difference between λL2 (a second wavelength) calculated from TL2 (the second period) and d2 (the second shift amount) (step S40).

d1 (the first shift amount) is the shift amount in the Y direction. The first difference is the shift amount in the −Y direction, which is the opposite direction to the Y direction. d2 (the second shift amount) is the shift amount in the Y direction. The second difference is the shift amount in the −Y direction, which is the opposite direction to the Y direction.

In the embodiment, when d1 (the first shift amount) and d2 (the second shift amount) are equal, it is concluded that the arrangement pattern 40 is shifted from the reference position 30p by an amount of the first shift amount or the second shift amount in the Y direction. When the first difference and the second difference are equal, it is concluded that the arrangement pattern 40 is shifted from the reference position 30p by an amount of the first difference or the second difference in the −Y direction, which is the opposite direction to the Y direction.

For example, the period of the first line pattern 10 is denoted by T1, and the period of the second line pattern 20 is denoted by T2. The period of the arrangement pattern 40 is denoted by T3. The period of the first moire pattern 50 is denoted by TL1, and the period of the second moire pattern 60 is denoted by TL2.

In this case, TL1 can be expressed by (T1×T3)/(T1−T3). TL2 can be expressed by (T2×T3)/(T2−T3). d1 can be expressed by (TL1/T3)×δ. d2 can be expressed by (TL2/T3)×δ.

Here, since T1 and T2 are not equal, TL1 and TL2 are different. Therefore, the wavelength λL1 calculated from TL1 and the wavelength λL2 calculated from TL2 are different.

When d1 and d2 are equal, there is no case where the difference (λL1−d1) between the wavelength λL1 and d1 and the difference (λL2−d2) between the wavelength λL2 and d2 are equal. Conversely, when (λL1−d1)d1 and d2(λL2−d2) are equal, there is no case where d1 and d2 are equal. These are calculated quickly by a measurement apparatus described later.

That is, when d1 and d2 are equal, the arrangement pattern 40 is shifted from the reference position 30p by d1 (or d2) in the Y direction (the right side of the drawing), and is not shifted in the −Y direction (the left side of the drawing).

Thus, the misalignment amount between the arrangement pattern 40 formed by the self-assembly phenomenon and the underlayer 70 can be determined.

By using the reference pattern 30, the positional shift amount between the opening 80h of the guide layer 80 and the underlayer 70 can be measured. Therefore, the positional shift amount between the guide layer 80 and the arrangement pattern 40 can be found by making subtraction between the positional shift amount between the arrangement pattern 40 and the underlayer 70 and the positional shift amount between the guide layer 80 and the underlayer 70. The flow shown in FIG. 2 is automatically performed in a measurement apparatus 5 illustrated below.

Figure 6:
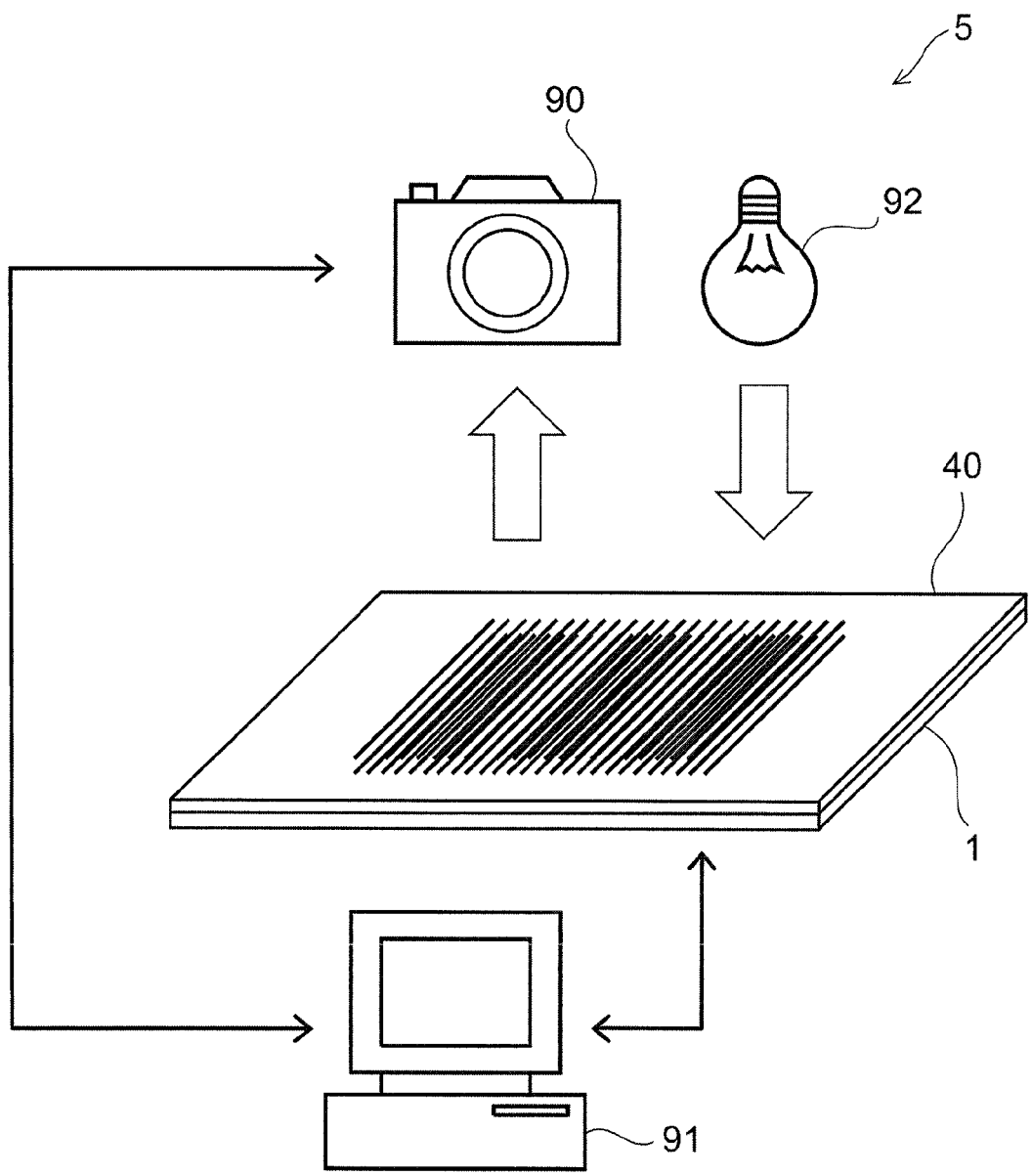
FIG. 6 is an overview diagram of a measurement apparatus according to the embodiment.

FIG. 6 is an overview diagram of a measurement apparatus according to the embodiment.

The measurement apparatus 5 is a measurement apparatus that detects the measurement mark 1. The measurement apparatus 5 includes a measurement means 90 such as a camera and a calculation means 91 capable of determining the shift amount described above, such as a computer.

The measurement means 90 measures the first shift amount from the reference position 30p of the first moire pattern 50, and measures the second shift amount from the reference position 30p of the second moire pattern 60.

The calculation means 91 determines the shift amount from the reference position 30p of the arrangement pattern 40 by means of the first shift amount (d1), the first difference between the first wavelength (λL1) calculated from the first period (TL1) and the first shift amount (d1), the second shift amount (d2), and the second difference between the second wavelength (λL2) calculated from the second period (TL2) and the second shift amount (d2).

Figure 7A:
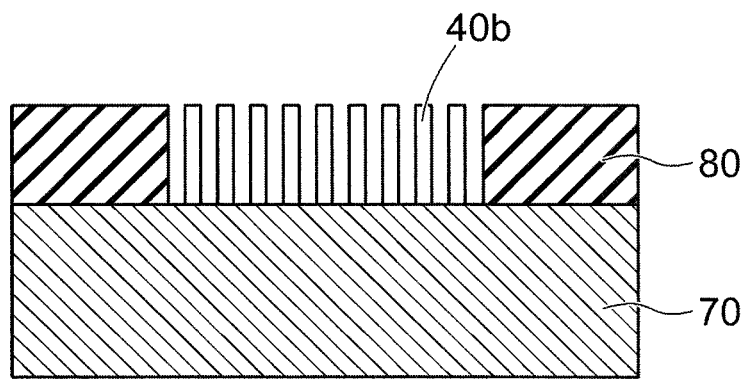
FIG. 7A and FIG. 7B are schematic cross-sectional views showing a method for manufacturing a semiconductor device according to the embodiment.
Figure 7B:
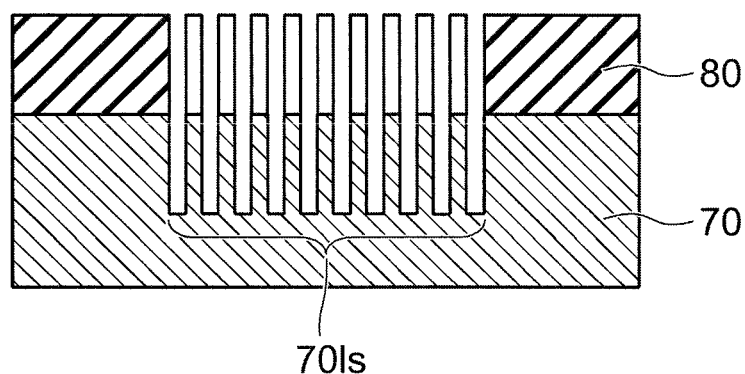

FIG. 7A and FIG. 7B are schematic cross-sectional views showing a method for manufacturing a semiconductor device according to the embodiment.

As shown in FIG. 7A, the first polymers 40a in the arrangement pattern 40 formed on the underlayer 70 are selectively removed.

Next, as shown in FIG. 7B, the second polymers 40b are used as a mask to perform dry etching such as RIE (reactive ion etching) on the underlayer 70. Thereby, a finely fashioned line and space pattern 70ls is formed in the underlayer 70. The manufacturing process of a semiconductor device is not performed on underlayers 70 in which the arrangement pattern 40 is shifted from the reference position 30p beyond a prescribed value. Thereby, the manufacturing yield of the semiconductor device is improved.

Thus, the embodiment further improves the inspection accuracy of the positional shift between the arrangement pattern utilizing a self-assembly phenomenon and the circuit pattern on the underlayer.

Hereinabove, embodiments are described with reference to specific examples. However, the embodiment is not limited to these specific examples. That is, one skilled in the art may appropriately make design modifications to these specific examples, and such modifications also are included in the scope of the embodiment to the extent that the spirit of the embodiment is included. The components of the specific examples described above and the arrangement, material, conditions, shape, size, etc. thereof are not limited to those illustrated but may be appropriately altered.

The term "on" in "a portion A is provided on a portion B" refers to the case where the portion A is provided on the portion B such that the portion A is in contact with the portion B and the case where the portion A is provided above the portion B such that the portion A is not in contact with the portion B.

Furthermore, components of the embodiments described above may be combined within the extent of technical feasibility, and combinations of them also are included in the scope of the embodiment to the extent that the spirit of the embodiment is included. Furthermore, one skilled in the art may arrive at various alterations and modifications within the idea of the embodiment. Such alterations and modifications should be seen as within the scope of the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A measurement mark comprising:
a first line pattern provided on an underlayer, a plurality of first lines extending in a first direction, the plurality of first lines being arranged in a second direction crossing the first direction in the first line pattern, the first line pattern forming a first moire pattern by overlapping with an arrangement pattern including a pattern, and a first polymer and a second polymer being alternately arranged in the pattern;
a second line pattern provided on the underlayer and aligned with the first line pattern in the first direction, a plurality of second lines extending in the first direction, the plurality of second lines being arranged in the second direction in the second line pattern, the second line pattern forming a second moire pattern with a second period different from a first period of the first moire pattern by overlapping with the arrangement pattern; and
a reference pattern provided on the underlayer and provided with a reference position configured to assess a first shift amount from the reference position of the first moire pattern and a second shift amount from the reference position of the second moire pattern.

2. The measurement mark according to claim 1, wherein a guide layer is provided on the underlayer, the guide layer surrounds the arrangement pattern, the guide layer has an opening, and the first line pattern and the second line pattern are exposed from the guide layer in the opening.

3. The measurement mark according to claim 1, wherein the reference pattern is aligned with the first line pattern and the second line pattern in the first direction or in an opposite direction to the first direction.

4. The measurement mark according to claim 1, wherein the reference pattern is aligned with the first line pattern and the second line pattern in the second direction or in an opposite direction to the second direction.

5. The measurement mark according to claim 2, wherein the reference pattern is covered by the guide layer.

6. A method for measurement comprising:
a step preparing a polymer mixture containing a first polymer and a second polymer on a first line pattern and on a second line pattern of a measurement mark, the measurement mark including the first line pattern, the second line pattern, and a reference pattern, the first line pattern being provided on an underlayer, a plurality of first lines extending in a first direction being arranged in a second direction crossing the first direction in the first line pattern, the first line pattern forming a first moire pattern by overlapping with an arrangement pattern including a pattern, the first polymer and the second polymer being alternately arranged in the pattern, the second line pattern being provided on the underlayer and aligned with the first line pattern in the first direction, a plurality of second lines extending in the first direction being arranged in the second direction in the second line pattern, the second line pattern forming a second moire pattern with a second period different from a first period of the first moire pattern by overlapping with the arrangement pattern, the reference pattern being provided on the underlayer and provided with a reference position configured to assess a first shift amount from the reference position of the first moire pattern and a second shift amount from the reference position of the second moire pattern;
a step phase-separating the polymer mixture to form the arrangement pattern on the first line pattern and on the second line pattern, the first polymer and the second polymer being alternately arranged in the arrangement pattern;
a step measuring the first shift amount from the reference position of the first moire pattern formed by overlapping of the first line pattern and the arrangement pattern and measuring the second shift amount from the reference position of the second moire pattern formed by overlapping of the second line pattern and the arrangement pattern; and
a step determining a shift amount from the reference position of the arrangement pattern by means of the first shift amount, a first difference between a first wavelength calculated from the first period and the first shift amount, the second shift amount, and a second difference between a second wavelength calculated from the second period and the second shift amount.

7. The method according to claim 6, wherein
the first shift amount is a shift amount in the second direction, the first difference is a shift amount in an opposite direction to the second direction, the second shift amount is a shift amount in the second direction, and the second difference is a shift amount in an opposite direction to the second direction, and
it is assessed that the arrangement pattern is shifted from the reference position by an amount of the first shift amount or the second shift amount in the second direction when the first shift amount and the second shift amount are equal.

8. The method according to claim 6, wherein
the first shift amount is a shift amount in the second direction, the first difference is a shift amount in an opposite direction to the second direction, the second shift amount is a shift amount in the second direction, and the second difference is a shift amount in an opposite direction to the second direction, and
it is assessed that the arrangement pattern is shifted from the reference position by an amount of the first difference or the second difference in an opposite direction to the second direction when the first difference and the second difference are equal.

9. The method according to claim 6, wherein a guide layer is provided on the underlayer, the guide layer surrounds the arrangement pattern, the guide layer has an opening, and the first line pattern and the second line pattern are exposed from the guide layer in the opening.

10. The method according to claim 6, wherein the reference pattern is aligned with the first line pattern and the second line pattern in the first direction.

11. The method according to claim 6, wherein the reference pattern is aligned with the first line pattern and the second line pattern in the second direction.

12. The method according to claim 9, wherein the reference pattern is covered by the guide layer.

13. A measurement apparatus configured to detect a measurement mark, the measurement mark including a first line pattern, a second line pattern, and a reference pattern, the first line pattern being provided on an underlayer, a plurality of first lines extending in a first direction, the plurality of first lines being arranged in a second direction crossing the first direction in the first line pattern, the first line pattern forming a first moire pattern by overlapping with an arrangement pattern including a pattern, and a first polymer and a second polymer being alternately arranged in the pattern, the second line pattern being provided on the underlayer and aligned with the first line pattern in the first direction, a plurality of second lines extending in the first direction, the plurality of second lines being arranged in the second direction in the second line pattern, the second line pattern forming a second moire pattern with a second period different from a first period of the first moire pattern by overlapping with the arrangement pattern, the reference pattern being provided on the underlayer and provided with a reference position configured to assess a first shift amount from the reference position of the first moire pattern and a second shift amount from the reference position of the second moire pattern, the apparatus comprising:

a measurement means configured to measure the first shift amount from the reference position of the first moire pattern and measure the second shift amount from the reference position of the second moire pattern; and a calculation means configured to determine a shift amount from the reference position of the arrangement pattern by means of the first shift amount, a first difference between a first wavelength calculated from the first period and the first shift amount, the second shift amount, and a second difference between a second wavelength calculated from the second period and the second shift amount.

14. The apparatus according to claim 13, wherein the first shift amount is a shift amount in the second direction, the first difference is a shift amount in an opposite direction to the second direction, the second shift amount is a shift amount in the second direction, and the second difference is a shift amount in an opposite direction to the second direction, and the calculation means determines that the arrangement pattern is shifted from the reference position by an amount of the first shift amount or the second shift amount in the second direction when the first shift amount and the second shift amount are equal.

15. The apparatus according to claim 13, wherein the first shift amount is a shift amount in the second direction, the first difference is a shift amount in an opposite direction to the second direction, the second shift amount is a shift amount in the second direction, and the second difference is a shift amount in an opposite direction to the second direction, and the calculation means determines that the arrangement pattern is shifted from the reference position by an amount of the first difference or the second difference in an opposite direction to the second direction when the first difference and the second difference are equal.

* * * * *